United States Patent [19]

Vernier

[11] 4,321,643
[45] Mar. 23, 1982

[54] GROUND MONITORING SYSTEM

[75] Inventor: Richard A. Vernier, Princeton, Ind.

[73] Assignee: AMF Incorporated, White Plains, N.Y.

[21] Appl. No.: 137,217

[22] Filed: Apr. 4, 1980

[51] Int. Cl.³ .............................................. H02H 5/10
[52] U.S. Cl. ...................................... 361/48; 361/47; 340/652; 324/51
[58] Field of Search ...................... 361/48, 47, 49, 50, 361/42, 79; 340/652, 649; 324/51

[56] References Cited

U.S. PATENT DOCUMENTS

| | | | |
|---|---|---|---|
| 3,676,739 | 7/1972 | Neuhouser | 361/48 |
| 3,729,653 | 4/1973 | Mankoff et al. | 361/48 |
| 4,075,675 | 2/1978 | Burkett et al. | 361/48 |
| 4,153,923 | 5/1979 | Graf | 361/48 |
| 4,228,475 | 10/1980 | Sherwood | 361/47 |

Primary Examiner—Patrick R. Salce
Attorney, Agent, or Firm—George W. Price; Lawrence Hager

[57] ABSTRACT

An improved ground monitoring circuit for detecting the integrity and proper connection of the ground conductors in an electrical cable of an electrical power distribution system of a type that is commonly used at a surface mining site. A complete conductive loop is established between the ground conductor, or conductors, and the ground check, or pilot wire of the cable. A sensing signal at a frequency higher than the power frequency is coupled onto the ground monitoring loop. The monitoring loop includes a terminating resistor of predetermined value. The sensing signal on the ground conductor in the loop is isolated from local ground by means of an impedance element that presents a high impedance at the sensing signal but not at the power frequency. The impedance element is connected between the ground conductor of the power cable and the local ground. When successive lengths of cable are series connected, the impedance elements are connected in parallel with each other and are connected from an end of the ground conductor to the local earth ground, thereby to avoid series connections of the impedance elements in the ground conductors.

The voltage and current in the loop are separately sampled. Various comparisons of the voltage and current samples are made to detect any deviation in the resistance of the loop. Any deviations from desired conditions in the loop produce an output signal that changes the condition of a trip relay. The trip relay initiates action that ultimately opens circuit breakers to remove power from the cable.

3 Claims, 5 Drawing Figures

GROUND MONITORING SYSTEM

BACKGROUND OF THE INVENTION

The present invention relates to monitoring the ground circuit in an electrical power distribution system of a type that is commonly employed at a location where coal is mined from the surface: i.e., at a strip mine. More particularly, this invention is an improvement over the invention disclosed in U.S. patent application Ser. No. 937,680 entitled Ground Monitoring System, in the name of John R. Sherwood, the disclosure of which is incorporated herein by reference.

In surface mining operations, extensive use is made of large electrically powered machinery such as power shovels, pumps, drills, etc. Accordingly, 600 volt to 25 kilovolt three phase electrical service may be provided at a remote surface mining site. Electrical utility company power lines are brought to a substation at or close to the mining site. Because much of the mining machinery must be movable, long insulated power cables that can be dragged along the ground connect the machinery to mobile switch houses that in turn are connected to the substation by additional long insulated power cables. There are a number of different types of power cables used in surface mining. One such type of cable includes the three power conductors, each with a metallic shield about it, two bare ground conductors, and an insulated ground check wire that commonly is called a pilot wire. All are enclosed in an insulating elastomeric jacket. Typically, the cables are in 1,000 feet lengths. Two or more cables commonly are connected together to extend the length of the distribution system.

If an insulation breakdown occurs in one of the large electrically powered pieces of machinery the entire machine may be at a dangerous high voltage unless it is protected by a suitable metallic ground circuit. In many instances the machine will be in contact with the earth, but because the machinery is moved around from place to place, a dependable earth ground resulting only from contact with the earth cannot be relied upon. Consequently, a metallic ground circuit in the power cable is essential. The Federal Coal Mine Health and Safety Act of 1969 requires that the electrical ground circuit in the power cable be continuously monitored to detect short circuits, open circuits, and abnormally high resistance conditions in the ground circuit. Upon detection of a fault condition the ground monitor must open one or more circuit breakers to disconnect the electrical source from the faulty portion of the distribution system.

A ground monitor intended for use at a surface mining location must be able to detect the condition that it is the metallic ground conductor of the power cable that is providing ground continuity in the system and not an earth ground resulting from the machine being in contact with the earth or water.

In the above mentioned Sherwood application, a test signal is coupled from a fault sensor circuit onto a ground monitoring loop in each length of cable. The loop includes the ground wires and pilot wire of the cable. The apparatus continuously monitors the integrity of the ground and pilot wires of the cable and produces a fault signal upon the occurrence of a short circuit, an open circuit, or high resistance that exceeds a predetermined normal value that is included as part of the loop. It is absolutely necessary to the proper operation of the apparatus of that system that the test signals propagate over the ground wire in the cable and not through earth ground. It is obvious that if the test signal can return to its source through earth ground as well as through the ground conductors of the cable it may be impossible to reliably monitor the conditions of the ground conductor. In the Sherwood application, an inductor that presents a large impedance to the test signal but not to the 60 Hz power current is connected in series with the ground conductors at the end of each length of cable. This large impedance blocks the test signal and prevents it from leaving the test loop of the respective length of cable.

This system operates satisfactorily, but does have several limitations. First, the large inductor connected in series with the ground conductors does add some resistance to the ground wires. Safety codes and regulations limit the amount of resistance that is permitted in the metallic ground circuit of the electrical distribution system at a surface mining site. With the inductor series connected with the ground wire of the cable, the number of cables that may be connected together in series without exceeding the permitted resistance value is limited to approximately five lengths of cable. At some mining locations more than five lengths of series connected cables are required. Consequently, the above system may not be adequate for all applications.

Furthermore, the fact that the inductor is series connected with the ground conductors represents a potential limiting factor in the integrity of the ground conductors of series connected cables. It is fundamental that the more components and connections that are placed in a series circuit, the greater the chances are that a fault will occur in the circuit.

BRIEF DESCRIPTION OF THE DRAWINGS

The invention will be described in connection with the accompanying drawings wherein.

DETAILED DESCRIPTION OF THE INVENTION

Figure 1:
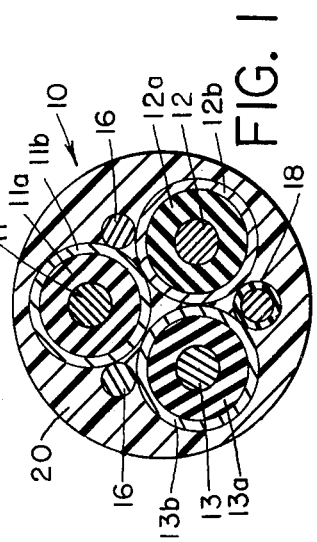
FIG. 1 is an illustration of a type of power cable that is to be monitored by the apparatus of the present invention.

FIG. 1 is a cross sectional representation of a typical electrical power distribution cable 10 of a type used to supply electrical power to machinery at a surface mine. The type chosen for representation is identified as SHD-GC-8 KV to 25 KV cable. Other types are available, but the type of FIG. 1 shall be used as the example throughout this description. The individual phase or power conductors 11, 12, and 13 are stranded metallic conductors and each is surrounded by respective insulating material 11a, 12a, and 13a and by a respective stranded conductive shield 11b, 12b, and 13b. The cable also includes two bare stranded ground conductors 16, and an insulated stranded ground check, or pilot wire 18. A jacket or sheath 20 of elastomeric insulation material surrounds all the conductors and wires.

Figure 2:
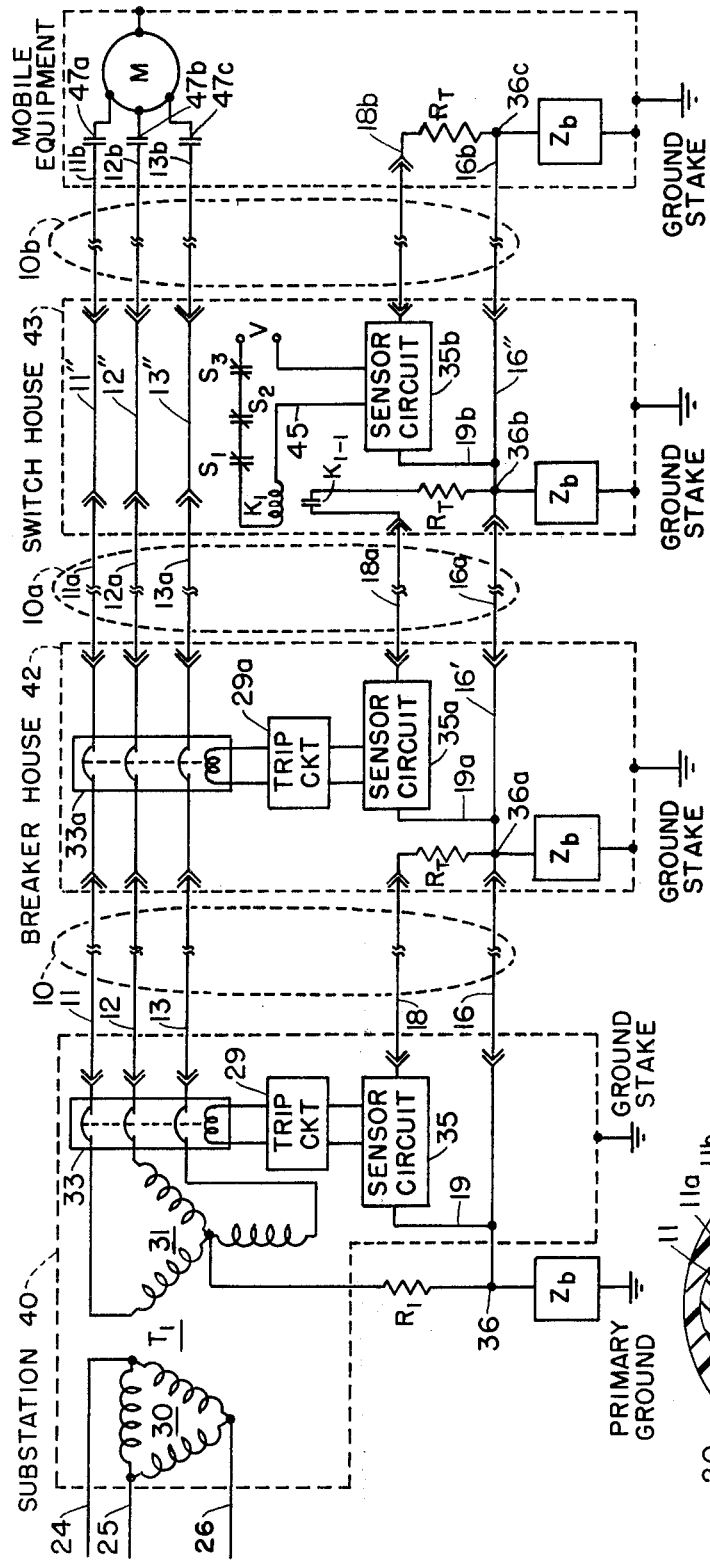
FIG. 2 is a simplified illustration of a representative power distribution system that might be found at a surface mine location, and includes the improved fault monitoring feature of this invention.

Electrical power distribution systems at surface mine locations vary considerably. FIG. 2 is a simplified schematic illustration that may be considered to be representative of what might be found at a surface mine.

High voltage from the electric utility company three phase system is coupled over open wires 24, 25, 26 to the delta connected primary windings 30 of transformer T1 at the substation 40. The substation structure is grounded by a local ground stake, as indicated.

The secondary winding 31 of transformer T1 is wye connected and its neutral point is connected through resistor R1 and impedance Zb to the primary ground of the mining site power distribution system. Resistor R1 is a current limiting resistor that is intended to limit the magnitude of any ground fault current to no more than 25 amps, or 50 amps, as examples.

Substation 40 includes large oil circuit breakers 33 in each of the phase or power conductors, 11, 12, and 13 of cable 10 of the mine power distribution system. The circuit breakers operate in response to trip circuit 29 to open the power conductors upon detection of a fault in the grounding system by the fault sensor circuit 35. The oil circuit breakers also operate to open the power conductors upon detection of an overcurrent, in the conventional manner. The ground conductors 16, the pilot wire 18, and the metallic shields around the power conductors (assumed to be included with ground conductor 16 in FIG. 2) all are grounded at point 36 to the primary ground through impedance Zb. As illustrated, sensor circuit 35 is coupled in a loop that includes pilot line 18, a terminating resistor RT, ground conductor 16 and conductor 19.

Cable 10 extends along the ground, for example, to a distantly located breaker house 42 that may be stationary or may be mounted on a sled so that it may be pulled about by a tractor or truck to different locations at the mining site. Breaker house 42 includes another oil circuit breaker 33a, trip circuit 29a, and suitable couplings and bus conductors for connecting the right ends of phase conductors 11, 12, and 13 of cable 10 to the circuit breaker.

The left ends of power conductors 11a, 12a and 13a of a second length of cable 10a are coupled in series with the corresponding conductors of the first section 10 through circuit breaker 33a. Cable section 10a is identical to the first section 10 and includes the ground conductor 16a and pilot wire 18a.

One end of terminating resistor Rt is connected to pilot wire 18 and the other end is connected to junction point 36a on a bus 16 in the ground conductor within breaker house 42. A blocking impedance Zb has one end connected to junction point 36a and its opposite end connected to earth ground. In practice, this earth ground will be a ground stake at the breaker house site. The earth ground on the broken line representing breaker house 42 indicates that conventional practice for grounding machinery, structures, etc., will be observed at breaker house 42.

Blocking impedance Zb is an impedance element that presents a large value of impedance to a fault sensing signal at 1,000 Hertz, as an example. Impedance element Zb blocks the sensing signal from flowing to earth ground, but presents a low value of impedance at the power frequency of 60 Hertz. In practice, blocking impedance Zb is an inductor made of heavy gauge wire that is wound on a core of magnetic material. The material operates into magnetic saturation at some given magnitude of 60 Hz fault current. Saturation of the core prevents the fault voltage across impedance Zb from exceeding a predetermined limit, thereby preventing a hazardous voltage from being developed thereacross.

Breaker house 42 includes sensor circuit 35a that is identical to sensor circuit 35. This second sensor circuit is in a series loop with pilot wire 18a and ground conductor 16a of the second cable section 10a. A second terminating resistor Rt that is included in this series loop physically is located in a distantly located portable switch house 43. One end of this second terminating resistor Rt is connected to the junction point 36b on the bus 16'' in the ground conductor. Again, a blocking impedance Zb is connected between junction point 36b on the cable ground conductor and earth ground (a local ground stake) at the switch house.

As illustrated in FIG. 2, switch house 43 does not include a circuit breaker for interrupting the power conductors. Instead, the output line 45 of sensor circuit 35b includes a relay coil $K_1$ that is coupled to a voltage source V through door interlock switches $S_1$, $S_2$, and $S_3$. The normally open contacts $K_{1-1}$ of relay $K_1$ are connected in series with pilot wire 18a and terminating resistor Rt in the ground circuit test loop of cable section 10a. Relay coil $K_1$ normally is energized so that contacts $K_{1-1}$ will close to complete the ground circuit test loop. When sensor circuit 35b senses a fault in the ground circuit of the next cable section 10b, relay coil $K_1$ will be deenergized. Contacts $K_{1-1}$ will open to break the ground circuit test loop in cable section 10a so that sensor circuit 35a will produce a fault signal that actuates trip circuit 29a. The contacts of circuit breaker 33a will open to remove power from cable section 10a.

Cable section 10b extends from switch house 43 to the piece of mobile equipment M which may be the motor for a shovel, drill, pump, etc. The power lines 11b, 12b, 13b are connected to motor M through contacts 47a, 47b, 47c of a heavy duty relay that commonly is called a contactor. Pilot wire 18b, terminating resistor Rt, ground conductor 16b and the section of bus 16'' are connected in a ground conductor test loop, as in the other sections. The test loop is coupled at junction point 36c through blocking impedance Zb to the local ground stake. As illustrated, motor M also is grounded to the local ground stake at the site of the mobile equipment.

It should be understood that a circuit breaker for interrupting the phase conductors could have been included in switch house 43 instead of relay $K_1$. However, the circuit breakers that are commonly used are large and heavy and thus are not ideally suited for a portable switch house that may have to be moved frequently.

All of the terminating resistors Rt have the same relatively low value such as 2.55 ohms, for example.

In considering the operation of sensing circuit 35 in substation 40, for example, the sensing circuit produces a sensing or test signal at 1,000 Hertz that is circulated in the loop comprised of pilot wire 18, terminating resistor Rt, ground wire 16 and conductor 19. If the conductors in the loop are in proper condition and correctly connected, the sensor circuit "sees" only the resistance of terminating resistor Rt (neglecting line resistances) and does not produce a fault signal. Circuit breakers 33 remain closed so that 60 Hz power is applied from the substation to power conductors 11, 12, and 13 of cable section 10. If sensor circuit 35 "sees" a resistance value in the sensing loop that is significantly greater than or significantly less than the value of terminating resistor Rt, it produces a fault signal that actuates trip circuit 29 and causes circuit breakers 33 to open.

It is seen that the blocking impedance Zb substantially prevent the sensing signal at 1,000 Hz from flowing to the earth grounds. Consequently, when a sensor circuit senses the proper voltage and current conditions, it indicates that the respective pilot wire and ground conductor are properly connected and in good condition and that a "sneak path" for current flow does exist through earth ground.

If the distribution system design were such that a "sneak path" for current flow does exist, the sensor circuit would have no way of knowing whether current flows through the ground conductor, as it should, or whether current flow is through earth ground. In this latter case, a ground conductor could be broken, shorted, or disconnected, and current could continue to flow back to the sensor circuit through a low resistance earth ground path.

In the above-mentioned Sherwood application, the blocking impedances were in series in the ground conductor. Each impedance means Zb was connected to the right of the respective junction points 36a, 36b, 36c, and each ground conductor 16, 16a, and 16b was directly connected to the local ground stake at a point just beyond each blocking impedance. Because the impedances were in series in the ground conductors 16 of the cable sections, the total resistance of the ground conductors of the distribution system to 60 Hz power became excessive and limited the number of cable lengths that could be cascaded without exceeding the permitted resistance value in the ground conductor. In accordance with the present invention, the respective blocking impedances Zb are parallel connected between the respective ground conductors and the local ground stakes. This maintains the isolation of each ground monitoring loop from the local earth ground when considering the fault monitoring signal at 1,000 Hz, while eliminating the series resistances in the ground conductors for the 60 Hz power circuit.

Figure 3:
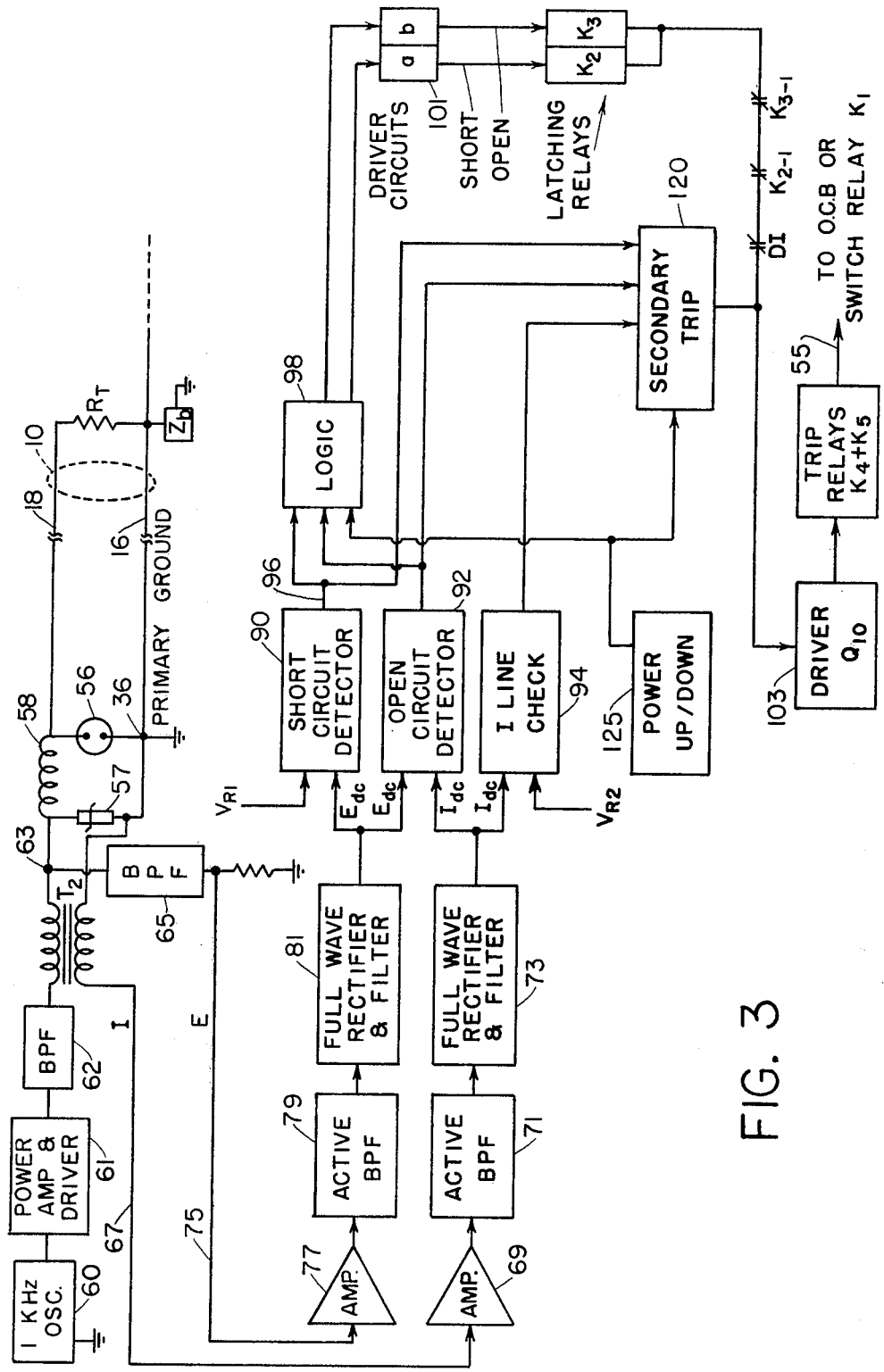
FIG. 3 is a simplified block diagram of the fault monitoring sensor circuit of the present invention.

A more detailed description of a sensor circuit 35, for example, will be given by referring to the simplified block diagram of FIG. 3. A 1,000 Hertz signal from oscillator 60 is amplified in power amplifier and driver means 61, is filtered in bandpass filter 62 to block 60 Hz and harmonic components of the 1 kHz signal, and is coupled through the primary winding of current sampling transformer T2 to pilot wire 18 of cable 10. This sensing or monitoring signal circulates in the ground monitoring circuit comprised of pilot wire 18, terminating resistor Rt, and ground conductor 16. For simplicity, only a single ground conductor 16 is illustrated in FIG. 3. In practice, two ground conductors and the power conductor shields that are illustrated in FIG. 1 are connected in parallel.

Voltage transients are suppressed by means of a voltage breakdown device 56, such as a gas discharge tube, that is connected between ground wire 16 and pilot wire 18. For the same purpose, a bipolar semiconductor voltage breakdown device 57, such as a back-to-back Zener diode device, also is connected between the ground and pilot wires. Choke coil 58 in series with pilot wire 18 also is employed for transient suppression.

A sample of the 1 kHz current flowing in the ground monitoring circuit is taken by transformer T2, and a voltage sample of the 1 kHz signal in the ground monitoring circuit is taken at junction point 63. The sampled current signal is coupled from the secondary winding of transformer T2 to the lead 67, is amplified in preamplifier 69, filtered in active bandpass filter 71, and is converted to a corresponding d.c. signal by full wave rectifier and filter 73. The voltage signal that is sampled at point 63 is filtered in active bandpass filter 65, is amplified in amplifier 77, again filtered in active bandpass filter 79 and is converted to a corresponding d.c. signal by full wave rectifier and filter 81.

The sensing of any deviation in parameter values in the monitored ground circuit is accomplished by the use of amplitude comparator circuits 90, 92, and 94.

The voltage sample signal Edc is coupled to short circuit detector 90 and is compared with a first d.c. reference voltage $VR_1$. Normally, the magnitude of the voltage sample signal Edc is greater than the magnitude of reference signal $VR_1$ and the output of the short circuit detector is low. In the presence of a short circuit in the test loop, the sampled voltage Edc will decrease to a magnitude less than $VR_1$ and the output of detector 90 will go high. This short circuit signal is coupled over lead 96 to a logic circuit 98 that will be described below in connection with FIG. 4. When the sensor circuit is operating properly to detect a fault, the short circuit signal is coupled to a respective relay driver 101a that actuates a respective latching relay $K_2$. The actuation of relay $K_2$ opens its contact $K_{2-1}$, causing driver circuit 103 to be deenergized. Normally energized trip relays $K_4$ and $K_5$ then are deenergized and their contacts open (or close, depending on the logic used) to deenergize the circuit breaker 33.

The magnitudes of the voltage signal Edc and the Idc current signal (actually a voltage) are compared in open circuit detector circuit 92. The parameters of the system are selected so that normally the magnitude of the current signal Idc is greater than voltage signal Edc. Normally, the output of open circuit detector 92 is low. Upon occurrence of an open circuit, the voltage in the monitored ground circuit will rise and the current will fall until the voltage signal Edc exceeds the current signal Idc. Comparator 92 will detect this change in relative magnitudes and its output will go high. This signal is coupled through logic circuit 98 and corresponding driver circuit 101b and actuates respective latching relay $K_3$. Actuation of relay $K_3$ opens its contact $K_{3-1}$ and deenergizes driver circuit 103. As explained above, normally energized trip relays $K_4$ and $K_5$ are deenergized and their contacts open (or close) to cause circuit breakers 33 to open.

From the above description it is evident that when the sampled voltage signal E increases beyond a predetermined limit the open circuit detector produces a fault signal, and when the sampled voltage signal falls below a predetermined limit the short circuit detector produces a fault signal. So far, no fault signal will be produced if only the current signal (Idc) goes high. This might occur if a short occurs in the sensor circuitry but not in the monitored grounding circuit. Current line check circuit 94 detects such a condition. It is a comparator circuit whose output signal is low under normal operating conditions during which the magnitude of reference signal $V_{R2}$ exceeds the magnitude of the sampled current signal Idc. In the event that the current signal Idc (actually a voltage) increases in magnitude to exceed $V_{R2}$, the output of current check circuit 94 goes high, thereby producing a fault signal.

The outputs of all of the comparator circuits 90, 92, and 94 are coupled to a secondary trip circuit 120. Secondary trip circuit 120 normally energizes driver circuit 103. When a fault signal is coupled through secondary trip circuit 120 to driver circuit 103, the latter is deenergized, thus causing trip relays K₄ and K₅ to be deenergized. This is a safety feature to assure that trip relays K₄ and K₅ are properly deenergized in case one or more of the driver circuits 101 or latching relays K₁ or K₂ should fail.

Power Up/Down Circuit 125 prevents the logic circuitry 93 and the secondary trip circuit 120 from being falsely triggered by transients and unstable conditions when power is first applied to the monitor and when the power drops below a given magnitude.

Figure 4:
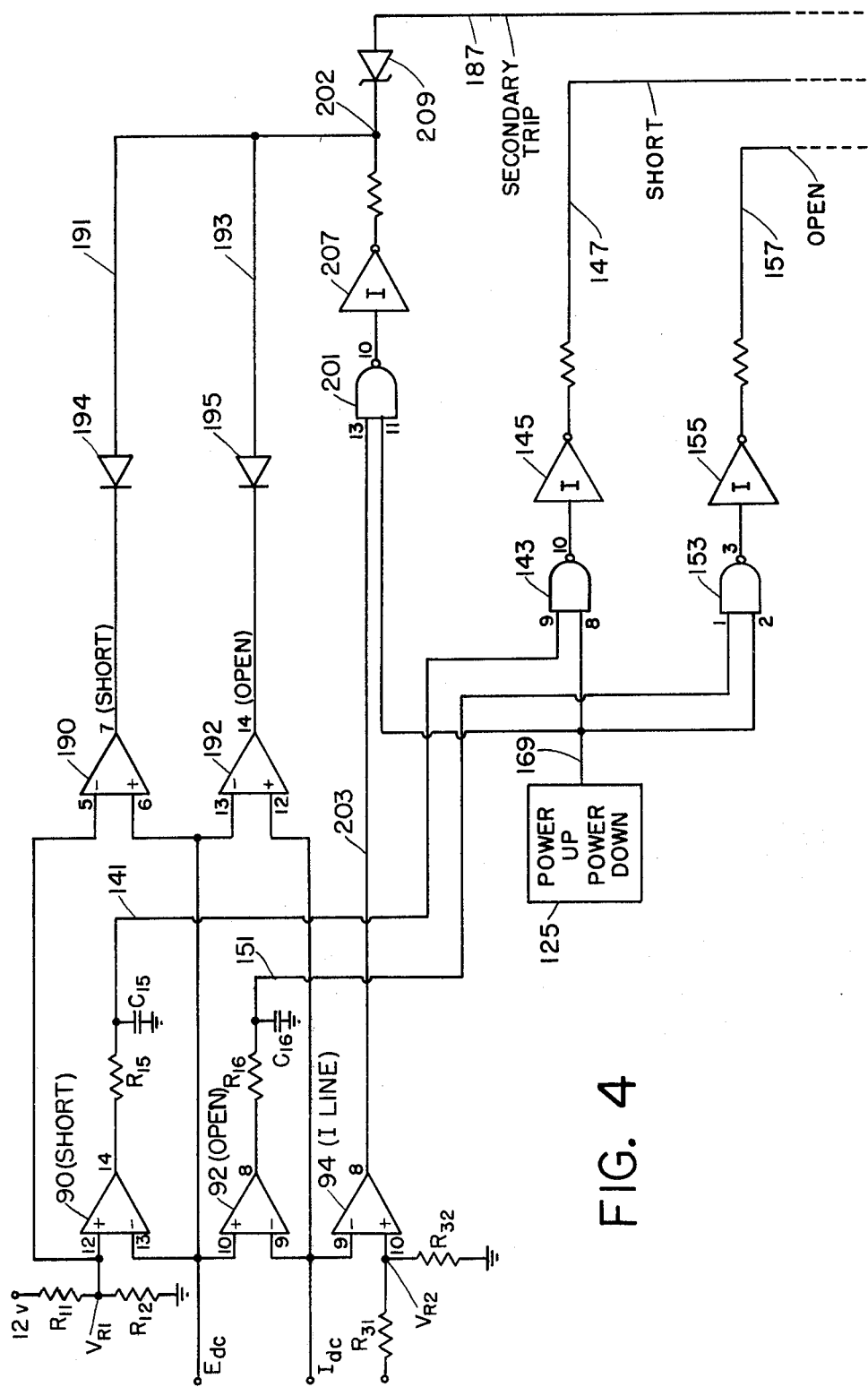
FIG. 4 is a simplified illustration of logic circuitry employed in the sensor circuit of FIG. 3.

Reference now will be made to FIG. 4 which illustrates in more detail the comparator circuits 90, 92, and 94, the logic circuit 98, and secondary trip circuit 120 of FIG. 3. Circuits that are to the left of the comparator circuits in FIG. 3 are conventional and well known circuits that one skilled in the art may easily provide. Consequently, those other circuits will not be described in FIG. 4.

The comparator that comprises short circuit detector 90 receives the sampled voltage signal Edc on its negative input pin 13 and the reference voltage $V_{R1}$ is picked off the voltage divider comprised of resistors $R_{11}$ and $R_{12}$ and is applied to the positive input pin 12. Under normal operating conditions the two input signals have predetermined magnitudes that are selected so that the magnitude of Edc exceeds $V_{R1}$. In normal operation the output signal from short circuit detector 90 is low. A short in the monitored grounding circuit will cause the magnitude of the sampled voltage signal Edc to fall below the magnitude of reference voltage $V_{R1}$. The output of short circuit detector 90 then will go high. Resistor $R_{15}$ and capacitor $C_{15}$ produce a brief delay of the order of 75–100 msecs. After this delay the short circuit signal is coupled over lead 141 to input pin 9 of NAND gate 143. The other input signal at pin 8 of NAND gate 143 should be high, as will be explained below, so that the output signal on pin 10 of NAND gate 143 will go low upon detection of a short circuit. This low signal is inverted by inverter 145 and appears as a high signal on lead 147.

The comparator that comprises open circuit detector 92 receives the two sampled signals at its respective input pins 10 and 9. Under normal conditions the magnitudes of the input signals are arranged so that the sampled current signal Idc is greater than the magnitude of sampled voltage signal Edc. The output signal of open circuit detector 92 normally is low. An open circuit or an abnormally high resistance value in the pilot wire of the monitored grounding circuit will cause the voltage signal Edc to rise and the current signal Idc to decrease. Open circuit detector 92 senses this change and its output goes high. This high signal is delayed by the resistor-capacitor combination $R_{16}$, $C_{16}$ and the delayed high signal is coupled over lead 151 to input pin 1 of NAND gate 153. The other input at pin 2 of NAND gate 153 will be high at this time so that the output signal at pin 3 will go low. Inverter 155 inverts the low signal so that a high signal that indicates the detection of an open circuit or a high resistance will be coupled over lead 157.

The second input to each of the NAND gates 143 and 153 was assumed to be a high signal on lead 169 from power up/power down circuit 125. Assuming that the sensor circuit power supply is functioning properly, the signal on lead 169 will remain high except for a brief period after power is first applied. This permits transients to die out before the logic circuitry is enabled. If the power supplied to the sensor should drop below a predetermined level, the signal on lead 169 will go low so as to disable NAND gates 143, 153, and 201. This prevents unstable and erratic operation of the logic circuitry.

Power up and power down circuits are commonly used and are well known to those skilled in the art. Suitable circuits are shown and described in the above-mentioned Sherwood application.

As described above, short circuit and open circuit signals may be provided on the respective leads 147 and 157. The fault sensing circuit of the present invention operates to provide a second fault signal on lead 187 when either the short or open circuit fault signals is produced. This second fault signal contributes a redundancy or fail-safe feature to the sensor circuitry of this invention and is produced as follows. The Power Up enabling signal on lead 169 is coupled to input pin 11 of NAND gate 201. The second input signal at pin 13 of NAND gate 201 is the I line output signal on output lead 203 of I line comparator 94. Comparator 94 is operated so that under normal conditions the reference voltage $V_{R2}$ that is taken from the voltage divider formed by resistors $R_{31}$ and $R_{32}$ has a greater magnitude than the current signal Idc applied to the negative input of the comparator. Under these normal conditions, the output signal on output lead 203 is high. Upon occurrence of a short circuit, the Idc signal will exceed the $V_{R2}$ signal and the output signal on lead 203 will go low.

Continuing with the inputs to NAND circuit 201, both input signals normally are high. Consequently, the output signal at pin 10 normally is low. This low signal is inverted by inverter 207 and is applied as a high signal to junction point 202 at the cathode of Zener diode 209. When a fault is detected, the output signal at pin 10 of NAND gate 201 goes high and is inverted to a low by inverter 207.

Two additional signals are applied to junction point 202 by way of leads 191 and 193. Lead 191 is coupled through diode 194 to the output pin 7 of redundant short circuit detector 190, and lead 193 is coupled through diode 195 to output pin 14 of redundant open circuit detector 192. It is seen that the respective input signals to the comparators of short circuit detector 190 and open circuit detector 192 are coupled to input pins of opposite polarities as compared to short circuit detector 90 and 92. For example, Edc input signal is coupled to the negative input pin of short circuit comparator 90, but is coupled to the positive input pin of redundant short circuit comparator 190.

Circuit parameters are chosen so that the output signals of the redundant short circuit and open circuit detectors 190 and 191 normally are high and go low in the presence of respective fault conditions. The respective normal high output signals are coupled to the cathodes of diodes 194 and 195 to back bias the diodes and prevent both from conducting. As a result, the signals coupled on leads 191 and 193 to junction point 202 will have no effect on the conduction of Zener diode 209. On the other hand, when a short circuit or open circuit occurs, the output signal of comparator 190 or 192 will go low and will cause one of the diodes 194 or 195 to conduct. The low signal is coupled through a diode to junction point 202. As explained above, in the presence of a fault the output of inverter 207 also is low. The low condition at junction point 202 will cause Zener diode 209 to cease conducting and will cause the secondary trip signal on lead 187 to go low. As will be explained immediately below, this low signal on lead 187 is a ground fault signal.

It may be seen that the redundant or fail-safe circuitry just described is capable of functioning to provide a fault signal on lead 187 even though the comparators 90, 92, 94, and NAND circuits 143 and 153 and/or the inverters 145 and 155 might fail.

Figure 5:
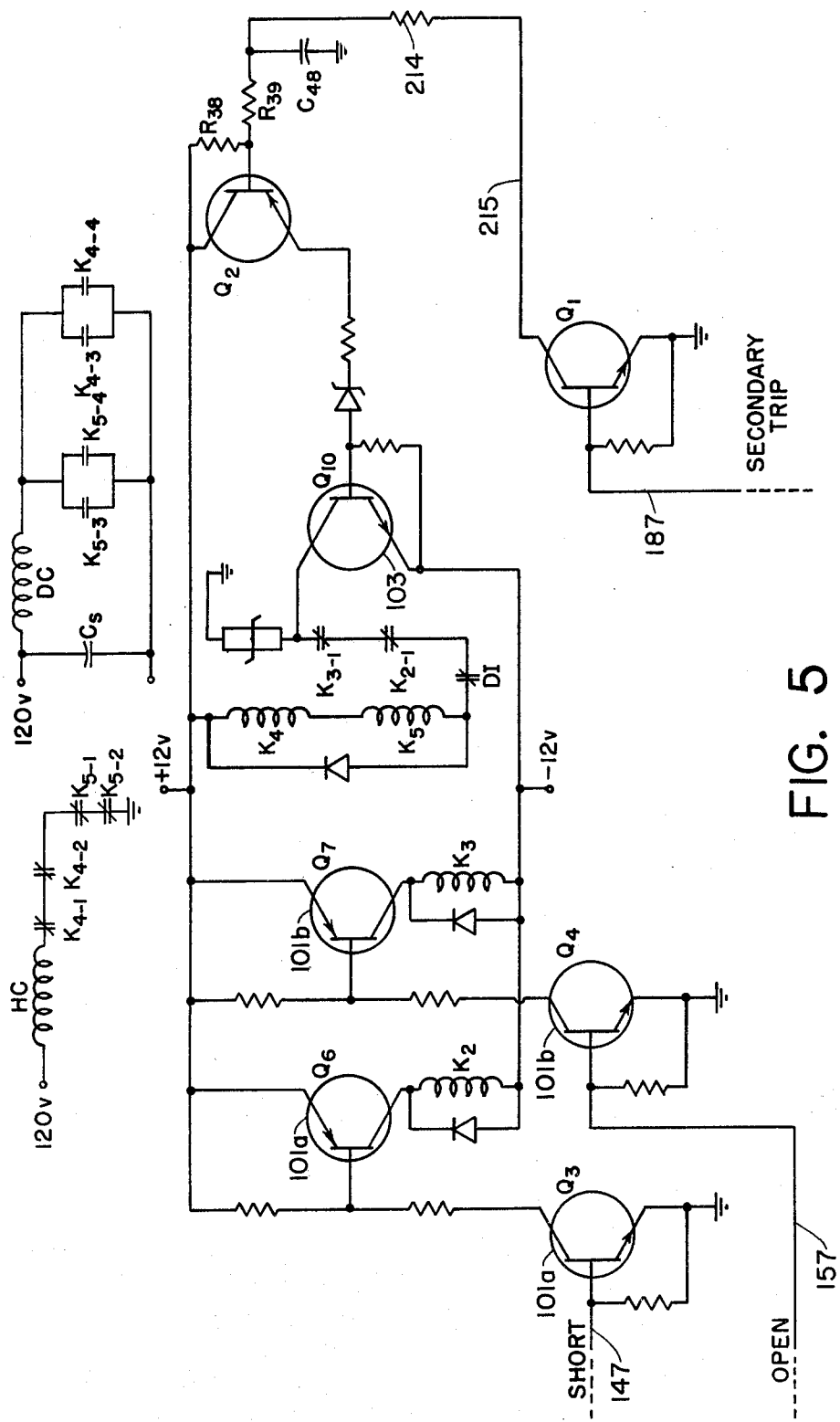
FIG. 5 is a schematic illustration illustrating the relay and switching means employed in the fault sensor system of this invention.

The remainder of the sensor circuitry is illustrated in FIG. 5 wherein short circuit and open circuit conductors 147 and 157 are shown at the left side of the figure and the secondary trip conductor 187 is shown at the lower center portion of the figure. By way of review, during normal operation in the absence of a fault signal, conductors 147 and 157 will be low and secondary trip conductor 187 will be high. Normally conducting transistor $Q_1$ keeps capacitor $C_{48}$ discharged by way of current limiting resistor 214 and lead 215, and places a low potential on the base of pnp transistors $Q_2$. Transistor $Q_2$ therefore is normally conducting and places a high potential on the base electrode of npn transistor $Q_{10}$ (driver circuit 103, FIG. 3). Transistor $Q_{10}$ therefore conducts by way of a current path from the plus 12 volt supply, through the windings of relays $K_4$ and $K_5$, through the closed contacts DI, $K_{2-1}$ and $K_{3-1}$, through the transistor $Q_{10}$ to the minus 12 volt supply. Contacts DI are door interlock contacts that close when the door to the cabinet that houses the apparatus is closed.

The short circuit and open circuit conductors 147 and 157 are coupled to the base electrodes of respective driver transistors $Q_3$ and $Q_4$. Because conductors 147 and 157 normally are low the npn transistors $Q_3$ and $Q_4$ normally will be nonconducting. Pnp transistors $Q_6$ and $Q_7$ have their respective base electrodes connected to the collector electrodes of transistors $Q_3$ and $Q_4$ and to the +12 volt supply. Transistors $Q_6$ and $Q_7$ therefore normally are non-conducting and the coils of latching relays $K_2$ and $K_3$ are unenergized.

Upon the occurrence of a fault signal on one of the conductors 147 and 157, one of the driver transistors $Q_3$ or $Q_4$ will conduct and a low potential will be coupled to the base electrode of the corresponding pnp transistor $Q_6$ or $Q_7$. When one of these latter transistors conducts, one of the windings of latching relays $K_2$ or $K_3$ will be energized to open one of the contacts $K_{2-1}$ or $K_{3-1}$, thereby deenergizing the winding of trip relays $K_4$ and $K_5$.

The two circuits at the top of FIG. 5 illustrate alternative ways of utilizing contacts of relays $K_4$ and $K_5$. All contacts $K_{4-1}$ through $K_{4-4}$ and $K_{5-1}$ through $K_{5-4}$ are illustrated in the conditions they will be in when their respective relay coils $K_4$ and $K_5$ energized. Considering first the illustration at the top left of FIG. 5, the winding HC is the holding coil of a circuit breaker 33 or 33a that would be used in the substation 40 or breaker house 42. When holding coil HC is energized it holds the circuit breaker contacts closed, as illustrated in FIG. 2. When the relay windings $K_4$ and $K_5$ of FIG. 5 are energized, as they are during normal operation, relay contacts $K_{4-1}$, $K_{4-2}$ and $K_{5-1}$, $K_{5-2}$ will close and circuit breaker holding coil HC will be energized to hold the breaker contacts closed. Upon detection of a fault, relay windings $K_4$ and $K_5$ will be deenergized and their contacts $K_{4-1}$, $K_{4-2}$ and $K_{5-1}$, $K_{5-2}$ will open. Circuit breaker holding coil HC will be deenergized and the circuit breaker contacts will snap open by operation of suitable means such as a spring mechanism.

The circuit on the upper right of FIG. 5 will be used where the circuit breaker is of the type where its contacts are held closed until a surge of current flows through its disconnect coil DC. The surge of current may be obtained from a charging capacitor Cs whose stored charge flows through discharge coil DC when contacts $K_{4-3}$, $K_{4-4}$ and $K_{5-3}$, $K_{5-4}$ are closed. These contacts are held open by their energized relay coils $K_4$ and $K_5$ during normal operation of the distribution system. When a fault condition is detected relay coils $K_4$ and $K_5$ are deenergized and their contacts $K_{4-3}$, $K_{4-4}$ and $K_{5-3}$, $K_{5-4}$ close to discharge capacitor Cs through disconnect winding DC which causes the circuit breaker contacts to open.

The particular arrangement and utilization of relays $K_4$ and $K_5$ and their contacts together with their energization means are merely illustrative of possible uses and should not be considered to limit the present invention. Collectively, they may be referred to as circuit control means that control the circuit breakers, relays 50, or other circuit interrupting means. It will be realized that relay $K_5$ is redundant to relay $K_4$ and is used solely as a safety feature.

If a fault condition were present in the monitored loop but for some reason a corresponding fault signal were not coupled from the comparator circuits 90 or 92 of FIG. 4 to a respective one of the driver transistors $Q_3$ or, FIG. 5, the fault signal on the secondary trip conductor 187 still will cause trip relays $K_4$ and $K_5$ to be deenergized. This occurs after a slight delay in the following manner. A fault signal on secondary trip conductor 187 is a low signal that causes normally conducting transistor $Q_1$ to cease conducting. Capacitor $C_{48}$ then begins to accumulate a charge by way of the plus 12 volt line and resistors $R_{38}$ and $R_{39}$. Capacitor $C_{48}$ and resistors $R_{38}$ and $R_{39}$ are chosen so that in approximately 500 msecs. capacitor $C_{48}$ will accumulate a sufficient charge to cause transistor $Q_2$ to turn off. This in turn causes normally conducting transistor $Q_{10}$ to turn off, thereby deenergizing the windings of trip relays $K_4$ and $K_5$. This secondary trip feature is a redundant of fail-safe feature. It normally will not be the cause for deenergizing relays $K_4$ and $K_5$ since the relays ordinally are deenergized by way of the opening of the contacts of latching relays $K_2$ or $K_3$.

We claim:

1. Apparatus for monitoring the condition of the ground conductor of an electrical cable in a power distribution system wherein said cable has power conductors, at least one ground conductor, and a pilot wire or the like, said power conductors being adapted to conduct electrical power at a given frequency, said apparatus comprising a terminating resistor of known resistance value, means for connecting one end of said resistor to said pilot wire at one end of said cable, means for connecting the other end of said resistor to the ground conductor at said one end of the cable, a sensor circuit coupled between the ground conductor and pilot wire at the opposite end of said cable, thereby to form a loop, said sensor circuit including means for coupling a sensing signal onto said loop and having means for detecting an open circuit and a short circuit on said loop, said sensing signal having a frequency different from said given frequency, inductance means for presenting a high, blocking impedance to said sensing signal but not to said power at the given frequency, means at said opposite end of the cable for connecting said inductance means between said ground conductor and a primary earth ground for the distribution system, a second inductance means substantially identical to the first-named inductance means, means at said one end of the cable for connecting said second inductance means in parallel with the first inductance means between the ground conductor at said one end of the cable and a local earth ground.

2. The combination claimed in claim 1 and further including, a second electrical cable having second power conductors, at least a second ground conductor, and a second pilot wire or the like, means at one end of the second cable for connecting the second power conductors to ends of corresponding power conductors at said one end of the first cable, thereby to extend the length of the power distribution system, a second terminating resistor having said known resistance value, means for connecting one end of the second resistor to said second pilot wire at the opposite end of said second cable, means for connecting the other end of said second resistor to the second ground conductor at the opposite end of said second cable, a second sensor circuit substantially identical to said first sensor circuit coupled between the second ground conductor and the second pilot wire at said one end of the second cable, a third inductance means substantially identical to said first two inductance means connected in parallel with said first two inductance means between the second ground conductor at said opposite end of said second cable and a local earth ground.

3. The combination claimed in claims 1 or 2 and including circuit breaker means series connected with the power conductors of said first cable and responsive to said first sensor means for disconnecting the power conductors of said first cable from said distribution system upon detecting an open circuit or a short circuit by said first sensor means.

* * * * *